United States Patent [19]

Matty

[11] Patent Number: 4,698,670

[45] Date of Patent: Oct. 6, 1987

[54] CABLE STEREO APPARATUS

[75] Inventor: Thomas C. Matty, N. Huntingdon, Pa.

[73] Assignee: Westinghouse Electric Corp., Pittsburgh, Pa.

[21] Appl. No.: 885,049

[22] Filed: Jul. 14, 1986

[51] Int. Cl.[4] .......................... H04N 7/10; H04N 7/06
[52] U.S. Cl. ...................................... 358/86; 358/189; 455/4
[58] Field of Search ................. 358/86, 144, 189, 198, 358/349; 380/19; 381/2; 455/3, 4, 6

[56] References Cited

U.S. PATENT DOCUMENTS 4,546,382 10/1985 McKenna et al. ................ 358/86 X
4,558,464 12/1985 O'Brien, Jr. ....................... 358/86 X

FOREIGN PATENT DOCUMENTS 55-45712 3/1982 Japan .................................. 358/189
62-49733 3/1987 Japan .

OTHER PUBLICATIONS

Thomas C. Matty, "User Friendly Cable Stereo Module", 1985, *NCTA Technical Papers*, Published by National Cable Television Association, pp. 134–139.

Primary Examiner—Keith E. George
Attorney, Agent, or Firm—D. Schron

[57] ABSTRACT

TV cable apparatus wherein a stereo module unit at a user location automatically provides for the presentation of an FM audo channel associated with a particular TV channel. The FM frequency allocations associated with the particular TV channels are stored ina computer memory which may be periodically revised. The cable operator periodically sends out the latest TV channel versus FM channel frequency allocation in an FSK coded data signal which is recognized by the stereo module unit which then proceeds with an updating, if required. The data signal is sent on a normally unused FM channel and in one embodiment if this channel is changed, the apparatus is operable to find the new data channel for channel map updating.

21 Claims, 10 Drawing Figures

| COL 1 | COL 2 | COL 3 | COL 4 | COL 5 |
|---|---|---|---|---|
| TV CHANNEL NO. | MONO TV AUDIO | STEREO 1 (MHz) | STEREO 2 (MHz) | FM (MHz) |
| 02 | 02 | 102.5 | 99.7 | 90.5 |
| 03 | 03 | — | — | 93.5 |
| 04 | 04 | 88.1 | — | 8.5 |
| 05 | 05 | — | 100.1 | 100.5 |
| 06 | 06 | 97.3 | 97.7 | 88.9 |
| 85 | 85 | 107.1 | — | 103.3 |

CABLE STEREO APPARATUS

BACKGROUND OF THE INVENTION

1. Field of the Invention:

The invention in general relates to subscriber cable systems, and particularly to improved apparatus in those systems in which stereo signals are delivered in the FM format.

2. Description of the Prior Art:

In a basic subscriber cable TV system, TV signals are transmitted from headend apparatus via the cable to a plurality of user locations where converter apparatus is operable to condition selected signals for presentation by a TV set.

In addition to this basic service, many cable operators are including transmission of signals within the FM band along with the TV signals. Such FM signals may include regular FM programs, stereo FM programs and simulcast programs in which the sound normally associated with a particular TV program is broadcast and presented in a stereo format as the viewer watches the TV program.

In one prior art system, a user would have to select a TV channel via the converter and then separately tune an associated FM receiver to the proper assigned frequency for simulcast reception, the TV channel and FM frequency assignments being supplied by the cable operator. Any change to a different TV channel would necessitate the additional retuning of the FM receiver as a separate step, or where simulcast reception is not provided on the other channel, the FM receiver would be turned off and the TV's normal audio portion would be turned up for viewer listening.

To obviate the inconvenience of having to separately tune two different units, another prior art apparatus provides for the selection of a TV channel with the simultaneous automatic tuning of an FM receiver apparatus to the proper FM frequency (if any) associated with the particular TV channel selected by the user. This is accomplished with a stereo module unit which includes an FM tuner and a microprocessor which controls the selection of the FM tuner. The microprocessor has an associated read-only-memory an EEPROM for example, into which is stored the individual TV channel numbers and the FM frequencies associated with respective channels, these assignments being designated as a channel map.

A user through a remote control unit enters a desired channel number. Upon reception, the microprocessor identifies the channel number and locates the corresponding FM frequency in the EEPROM and thereafter controls the frequency selection of the FM tuner to this frequency. In the absence of any frequency designation, the microprocessor will control a separate and distinct TV tuner for presentation of the audio portion of the TV picture.

This arrangement works quite satisfactorily as long as there are no changes in the FM frequency assignments. Any change in the channel map, however, would require operator personnel to visit every subscriber in order that the EEPROMs in the stereo module units be updated wih the latest channel map, such updating being accomplished either by a reprogramming or a replacement of the EEPROM.

The present invention obviates this requirement for repeated visits by the cable operator to the individual subscribers in order to accomplish channel map updating.

SUMMARY OF THE INVENTION

In the system of the present invention means are provided for assigning and associating one or more FM channels to a particular TV channel to constitute a TV-FM stereo-channel map and for varying the assignment. Means are provided for transmitting, from a cable operator to a user, a data signal to be transmitted on a predetermind FM frequency which may be selectively changed by the operator.

The data signal, as opposed to the conventional FM audio signal, includes the latest channel map assignments. A stereo module unit at the location of the user includes means operable to extract the data signal from the other FM signals transmitted and to store the channel map information so extracted. This operation normally occurs when the stereo module unit is in an off condition. Thereafter, when a user tunes to a particular TV channel, any assigned FM channel associated with that particular TV channel will be automatically selected for presentation.

DESCRIPTION OF THE PREFERRED EMBODIMENTS

Figures 1, 2:
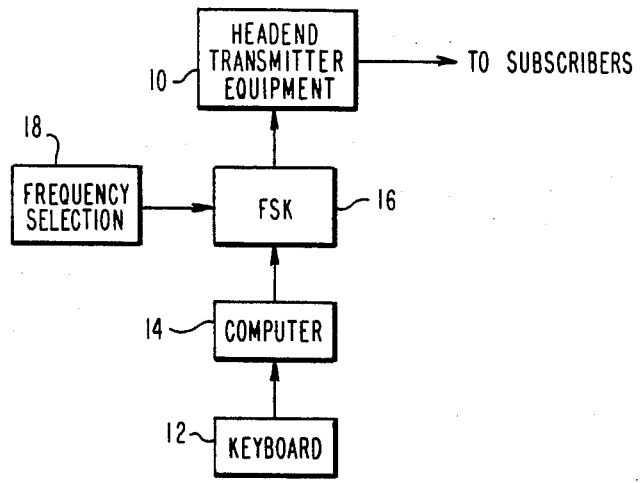
FIG. 1 is a block diagram basically illustrating the cable operator's equipment for practicing the present invention.
FIG. 2 illustrates a typical channel map.

Referring now to FIG. 1, numeral 10 represents the headend transmitter equipment by means of which the cable operator transmits a spectrum of signals including TV and FM channels to subscriber units.

In accordance with the present invention the latest FM frequency assignments associated with particular TV channels (the channel map) is additionally transmitted to the subscriber units along with the regular programs.

The frequency allocations are inputted, for example, by means of keyboard 12 to a computer 14 which is operable to place the channel map into a coded form. By way of example a typical channel map is illustrated in FIG. 2 wherein the first column designates the cable TV channel number and the second column represents the monaural audio sourcer. One or more FM programs are associated with various ones of the TV channels and column 3 represents the FM frequencies of a first stereo channel, and column 4 illusrates typical FM frequencies of a second stereo channel which may be selected by the user. The fifth column illustrates the frequencies of various FM stations which may be selected by the subscriber for listening in a FM receiver mode wherein the TV is off. A horizontal line in a column indicates that there are no FM frequency allocations under that particular heading.

Figure 3:
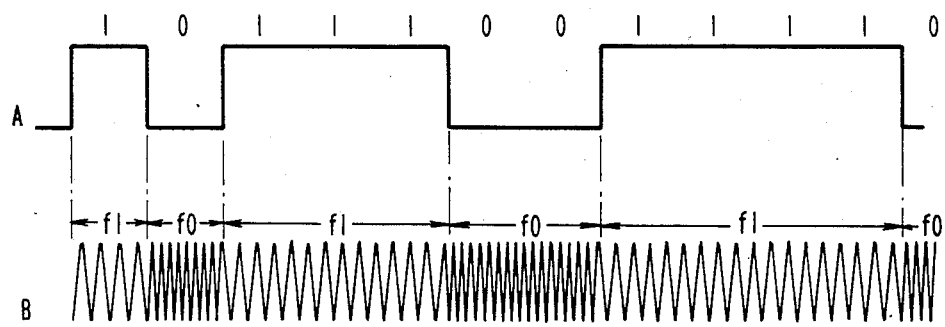
FIGS. 3A and 3B illustrate one type of coding which may be utilized in the practice of the present invention.

Having the channel map information, the computer converts it to a code consisting of, for example, a series of binary ones and zeros such as illustrated in FIG. 3A depicting a portion of a coded channel map. The code is transmitted with the provision of frequency shift keying (FSK) apparatus 16 with the carrier frequency being selectively chosen by the operator by means of frequency selection circuit 18. After frequency shift keying, the data stream emanating from computer 14 will be transmitted by equipment 10 along with the normal signals as the waveform illustrated in FIG. 3B consisting of two frequencies $f_1$ and $f_0$ corresponding to the binary one and zero values.

Figure 4:
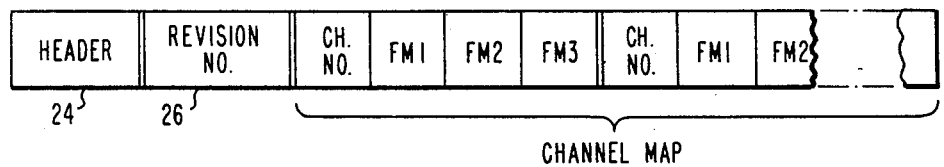
FIG. 4 illustrates the typical contents of a data signal.

FIG. 4 illustrates the contents of a typical transmitted signal. The signal will have an initial header portion to identify the beginning of a message followed by a portion 26 to identify exactly which channel map revision is being transmitted. The revised TV channel versus FM frequency allocations follow and the entire message is repetitively transmitted to the subscriber units in a period of time depending upon the number of channels and frequency allocations.

Figure 5:
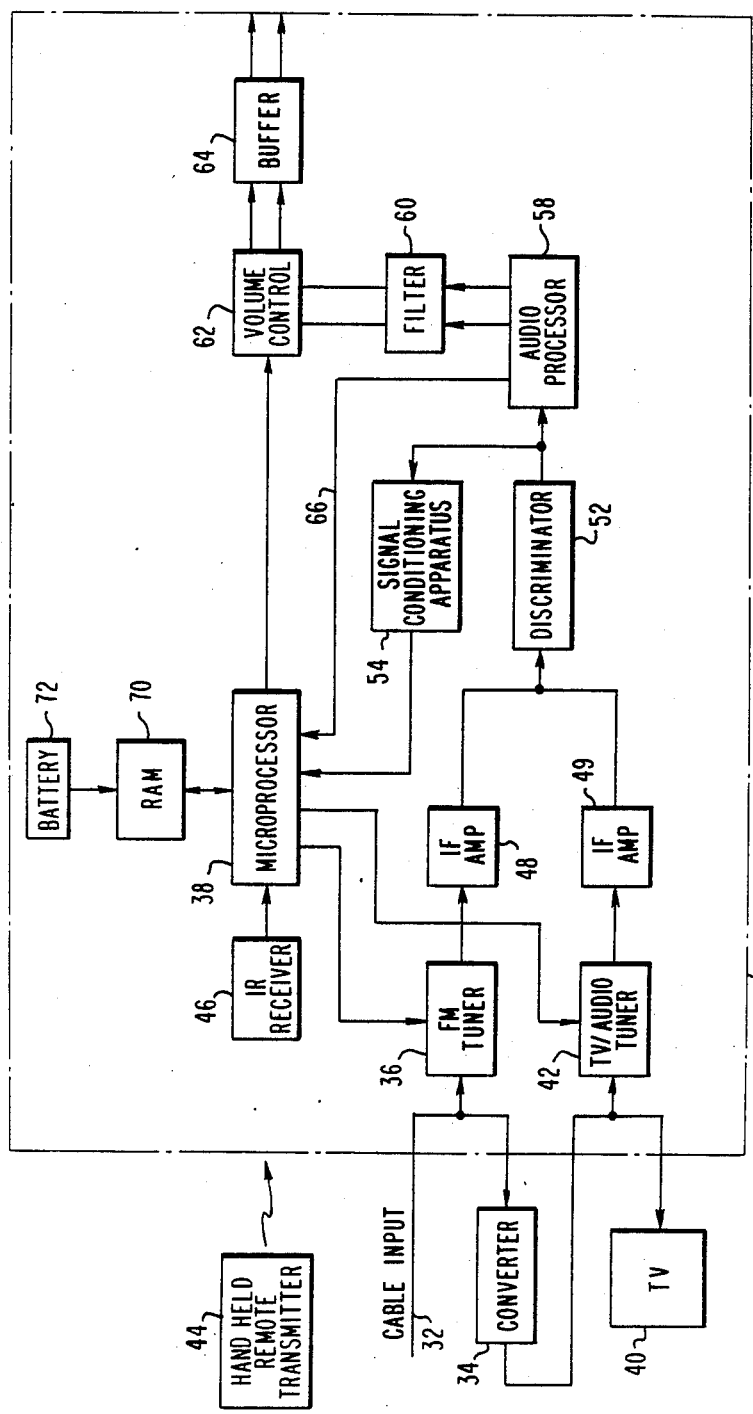
FIG. 5 is a block diagram of the stereo module unit at the user location.

FIG. 5 illustrates one embodiment of a stereo module unit 30 at a user location. The cable input 32 connected to the normally provided converter unit 34 is tapped and fed to an FM tuner 36 under the control of, and selectively tunable by, microprocessor 38 in a well known manner.

The output of converter 34 leading to the TV set 40 is also tapped and provided to a TV tuner 42 also under the control of, and being selectively tunable by, microprocessor 38 for processing the audio portion of a TV program.

In a preferred mode of operation, channel selection may be controlled remotely by means of a hand-held remote transmitter 44 operable to transmit infrared (IR) coded signals which are picked up by an IR receiver 46 and provided to microprocessor 38. The described components of the stereo module and their operation are well known, as are the IF amplifiers 48 and 49 connected to respective tuners 36 and 42. Since microprocessor 38 will select only one of the two tuners, only one discriminator 52 is required for demodulation purposes.

Figure 6:
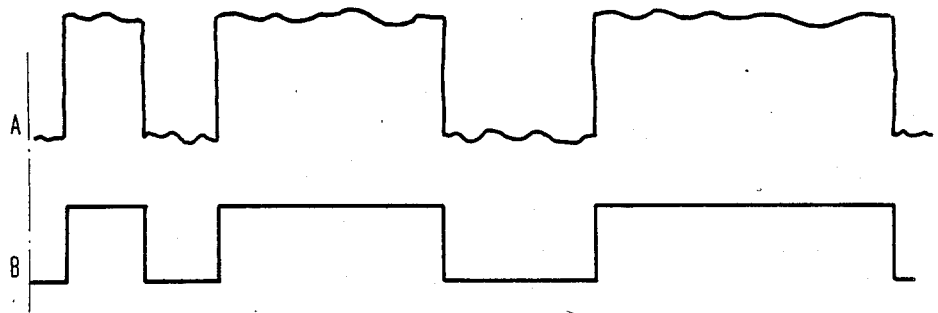
FIGS. 6A and 6B illustrate certain waveforms present in the apparatus of FIG. 5.

In accordance with the present invention the processed FM signal is provided to the microprocessor 13 for recovery of the encoded channel map, as will be described. The coded signal, as provided for example, by discriminator 52 may appear as a rough waveform such as illustrated in FIG. 6A and signal conditioning apparatus 54 is provided in order that the original binary one and zero format, as illustrated in FIG. 6B, is presented to the microprocessor.

In accordance with known stereo module signal processing, an audio processor 58 is provided to function as a stereo decoder for separating the L and R signals which are then filtered in pilot filter 60 which filters out the pilot component found within the audio signal. The signal is then fed to an electronic volume control 62, the operation of which is also governed by microprocessor 38 as dictated by a user generated volume command. Prior to being provided to a stereo system or a set of powered speakers, the volume controlled signal is provided to a buffer 64.

If during operation, a stereo signal is present, this fact is communicated to the microprocessor 38 from the audio processor 58 by means of an appropriate signal on line 66.

As opposed to the read-only-memory for storing the channel map, as provided in prior art systems, the present arrangement includes a random-access-memory (RAM) arrangement whereby data may be written into the memory by the microprocessor 38 and updated, when required, and thereafter extractd during operation of the unit. Such memory arrangement may be of the type which retains stored information even in the presence of a power failure or the intentional removal of power from the stereo module unit. This retention of stored data may be accomplished with the provision of a battery source 72 which in the case of lithium batteries will maintain the stored information over a period of many years in the absence of external power.

Figure 7:
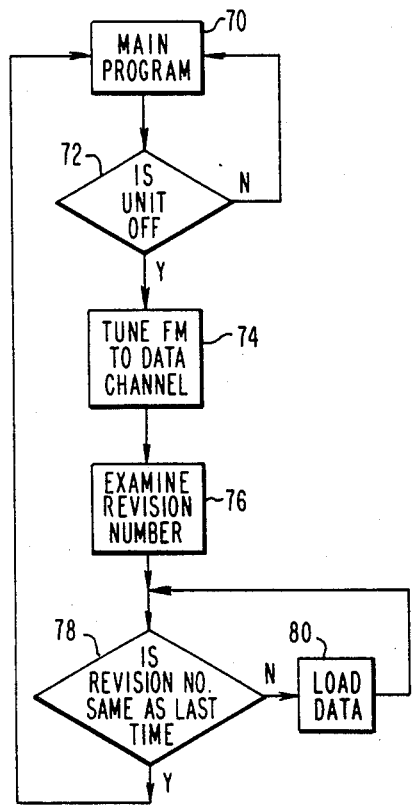
FIGS. 7 and 8 are flow charts illustrating the operation of the stereo module unit.

Operation of one embodiment of the invention will now be described with reference to FIG. 7 which shows a flow chart for microprocessor operation apart from its normal main program 70. In order to avoid interruption of normal reception, channel map updating takes place when the stereo module unit 30 is in an off condition. Accordingly, in FIG. 7, a decision is made at step 72 as to whether or not the unit is off. If the unit is not off, the decision dictates a return to main program 70. If however the unit is off, FM tuner 36, under control of the microprocessor 38 is caused to tune to the data channel, that is, the carrier frequency on which the channel map is being transmitted, as indicated at step 74. If the latest channel map, as indicated by the revision number for example, is the same as the last transmitted channel map, then no update need be performed (although it can be if desired) and, as indicated by steps 76 and 78, the process returns to the main program 70. If the revision number is not the same as last transmitted, then the new data are loaded as indicated by step 80 and constituting an update of the channel map stored in memory 70. Once the loading operation has been accomplished, the revision number will be the same and an exiting to the main program 70 will take place.

In this first embodiment a cable operator has selected an unused FM channel for communication of channel map updating to the various subscriber units. The normally unused FM channel used for data communication in one geographical location may possibly be utilized by a broadcasting station in another location. Additionally, even in the same geographical location, the FM channel presently used for data communication may in the future be assigned to a radio station. In a second embodiment of the present invention the apparatus is operable to communicate the updated channel map to subscriber units even if an assigned data channel is required for other use.

Figure 8:
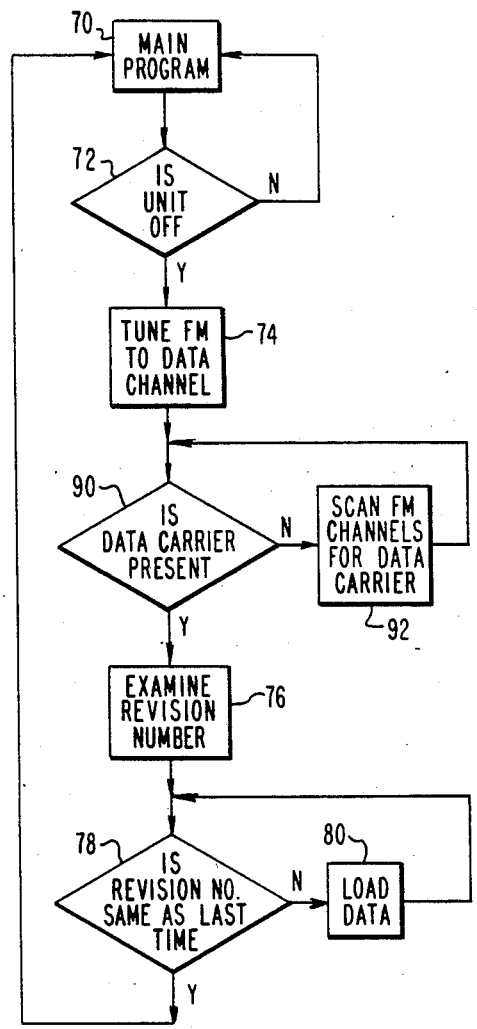

In one mode of operation, the microprocessor 38, when the unit is in an off condition, is operable to control the tuning to the assigned channel for data transmission. If the conditioned output from discriminator 52 is not identifiable by the microprocessor 38 as a data signal, as opposed to the normal audio, then microprocessor 38 causes the FM tuner 36 to scan the frequency band until the data signal is captured, whereupon channel map updating may take place, if required. The operation of the microprocessor 38 is illustrated in the flow chart diagram of FIG. 8 wherein steps similar to those described with respect to FIG. 7 are given similar reference numerals. The second embodiment adds a decision step 90 which determines whether the data carrier is present in the FM channel last identified as the data channel. If the channel is the same, then the operation proceeds as the first embodiment. If the data carrier is not present, and as indicated by step 92, the microprocessor causes the scanning of the FM channels until the data carrier is recognized. If desired, the microprocessor could immediately start the scanning process to find the data channel, eliminating the step of initially tuning to the last known data channel.

Accordingly there has been described an arrangement wherein a cable subscriber may be provided with regular FM, stereo FM and simulcast FM whereby the subscriber can remotely tune to a TV channel and automatically receive an associated FM channel. Any change in the FM frequency allocations are automatically updated without the requirement for component changes at the subscriber location.

I claim:

1. A cable system wherein an array of TV and FM signals are provided by an operator to a user comprising:
   (A) means for assigning one or more FM channels to a particular TV channel and for varying said assignment, if desired, said assignment constituting a TV-FM channel map;
   (B) means for transmitting to said user, along with said array of signals, a data signal, said data signal being transmitted on a predetermined FM frequency;
   (C) said data signal including said channel map assignments;
   (D) a stereo module unit for operation at the location of said user;
   (E) said stereo module unit including means operable to receive and extract said data signal from said array of signals and to store said channel map assignments and further operable that, when a user tunes to a particular TV channel, any assigned FM channel associated with said particular TV channel will be selected for audio presentation.

2. Apparatus according to claim 1 wherein:
   (A) said means for transmitting a data signal includes means for selectively changing said predetermined FM frequency.

3. Apparatus according to claim 1 wherein:
   (A) said means for transmitting a data signal includes:
     (i) means for generating a binary representation of said channel map assignments, and
     (ii) means for modulating said binary representation, for transmission.

4. Apparatus according to claim 3 which includes:
   (A) frequency shift keying (FSK) apparatus operable to modulate said binary representation.

5. Apparatus according to claim 1 wherein:
   (A) said data signal includes a header portion to initially identify said data signal as a data signal.

6. Apparatus according to claim 5 wherein:
   (A) said data signal includes a portion to identify which particular channel map update is being transmitted.

7. Apparatus according to claim 1 wherein:
   (A) said stereo module unit includes
     (i) a microprocessor;
     (ii) a memory means of the type which can accept data from, and provide data to, said microprocessor.

8. Apparatus according to claim 7 wherein:
   (A) said memory means includes a random access memory (RAM); and which includes
   (B) a battery connected to said RAM for providing said RAM with electrical power to retain its stored contents.

9. Apparatus according to claim 7 wherein:
   (A) said stereo module unit includes
     (i) an FM tuner, an IF amplifier and a discriminator for processing FM signals;
     (ii) said microprocessor being operable to control the frequency selection of said tuner;
     (iii) said microprocessor being operable to tune said FM tuner to said predetermined FM frequency of said data signal;
     (iv) said microprocessor being connected to receive the processed FM signals for accepting said data signal and storing the latest channel map assignments in said memory means.

10. Apparatus according to claim 9 wherein:
    (A) said microprocessor is connected to receive the output signal of said discriminator.

11. Apparatus according to claim 9 wherein:
    (A) said micrprocessor is operable to adjust said FM tuner to said predetermined FM frequency only during off periods of said audio presentation by said stereo module unit.

12. Apparatus according to claim 7 wherein:
    (A) said stereo module unit includes
      (i) an FM tuner, an IF amplifier and a discriminator for processing FM signals;
      (ii) said microprocessor being operable to control the frequency selection of said tuner;
      (iii) said microprocessor being operable to tune said FM tuner to said predetermined FM frequency of said data signal;
      (iv) said microprocessor being further operable if said data signal is not present on said predetermined FM frequency, to cause said FM tuner to scan the band of FM frequencies until said data is identified.

13. Apparatus according to claim 12 wherein:
    (A) said microprocessor is operable to adjust said FM tuner to said predetermined FM frequency only during off periods of said audio presentation by said stereo module unit.

14. Apparatus according to claim 7 wherein:
    (A) said stereo module unit includes
      (i) an FM tuner, an IF amplifier and a discriminator for processing FM signals;
      (ii) said microprocessor being operable to control the frequency selection of said tuner;
      (iii) said microprocessor being connected to receive said processed FM signals,
      (iv) said microprocessor being further operable, during predetermined periods of operation, to cause said FM tuner to scan the band of FM frequencies until said data signal is identified, whereupon the latest channel map assignments may be stored in said memory means.

15. Apparatus according to claim 14 wherein:
    (A) said microprocessor is connected to receive the output signal of said discriminator.

16. Apparatus according to claim 14 wherein:
    (A) said microprocessor is operable to adjust said FM tuner to said predetermined FM frequency only during off periods of said audio presentation by said stereo module unit.

17. Apparatus according to claim 9 which includes:
    (A) means for conditioning said data signals prior to presentation to said microprocessor.

18. Apparatus according to claim 10 which includes:
(A) signal conditioning means connected in circuit between said output of said discriminator and said microprocessor, to condition said data signals.

19. A stereo module unit operable to receive FM signals transmitted by an operator along with TV signals, with a predetermined number of said FM signals to be presented in audio format along with corresponding TV channels, wherein TV-FM assignments are transmitted by the operator as a data signal, comprising:
(A) means for receiving said signals; and
(B) means operable to extract said data signal from the other transmitted signals and to store said assignments so that when a user tunes to a particular TV channel, any assigned FM channel associated with said particular TV channel will be selected for audio presentation.

20. Apparatus according to claim 19 which includes:
(A) a microprocessor;
(B) a memory means of the type which can accept data from, and provide data to, said microprocessor;
(C) an FM tuner, an IF amplifier and a discriminator for processing FM signals;
(D) said microprocessor being operable to receive the processed FM signals and to tune said FM tuner to the frequency on which the data signal is transmitted whereupon the latest said assignments may be stored in said memory means.

21. Apparatus according to claim 20 which includes:
(A) battery means connected to said memory means for providing said memory means with electrical power so as to retain its stored contents in the absence of external electrical power.

* * * * *